United States Patent
Sugo et al.

(10) Patent No.: US 9,484,240 B2
(45) Date of Patent: Nov. 1, 2016

(54) FILM ADHESIVE, DICING TAPE WITH FILM ADHESIVE, METHOD OF MANUFACTURING SEMICONDUCTOR DEVICE, AND SEMICONDUCTOR DEVICE

(71) Applicant: NITTO DENKO CORPORATION, Ibaraki-shi, Osaka (JP)

(72) Inventors: Yuki Sugo, Ibaraki (JP); Yuta Kimura, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 6 days.

(21) Appl. No.: 14/183,823

(22) Filed: Feb. 19, 2014

(65) Prior Publication Data

US 2014/0231983 A1  Aug. 21, 2014

(30) Foreign Application Priority Data

Feb. 20, 2013 (JP) ................ 2013-031336
Jan. 8, 2014 (JP) ................ 2014-001514

(51) Int. Cl.
*H01L 21/683* (2006.01)
*H01L 23/48* (2006.01)
(Continued)

(52) U.S. Cl.
CPC ......... *H01L 21/6836* (2013.01); *C08G 59/621* (2013.01); *C09J 7/02* (2013.01); *C09J 9/02* (2013.01); *C09J 11/04* (2013.01); *C09J 163/00* (2013.01); *H01L 21/50* (2013.01); *H01L 23/48* (2013.01); *H01L 24/27* (2013.01); *H01L 24/29* (2013.01); *H01L 24/83* (2013.01); *H01L 24/85* (2013.01); *H01L 24/92* (2013.01); *C08K 3/08* (2013.01); *C09J 2201/36* (2013.01); *C09J 2201/622* (2013.01); *C09J 2203/326* (2013.01); *C09J 2205/102* (2013.01); *H01L 24/32* (2013.01); *H01L 24/45* (2013.01); *H01L 24/48* (2013.01); *H01L 24/94* (2013.01); *H01L 2221/68327* (2013.01); *H01L 2221/68377* (2013.01); *H01L 2221/68381* (2013.01); *H01L 2221/68386* (2013.01); *H01L 2224/271* (2013.01); *H01L 2224/27003* (2013.01); *H01L 2224/27436* (2013.01);
(Continued)

(58) Field of Classification Search
CPC .... H01L 21/6836; H01L 21/50; H01L 23/48
USPC ......... 438/118; 428/220, 343, 40.2; 257/734
See application file for complete search history.

(56) References Cited

U.S. PATENT DOCUMENTS 5,605,763 A  2/1997 Yusa et al.
5,667,899 A  9/1997 Yusa et al.
(Continued)

FOREIGN PATENT DOCUMENTS

JP  06-145639  5/1994
JP  4137827  8/2008

*Primary Examiner* — Christine Enad
(74) *Attorney, Agent, or Firm* — Knobbe Martens Olson & Bear, LLP

(57) ABSTRACT

The present invention provides a film adhesive that can prevent a thermal effect to a semiconductor wafer and that can suppress warping of the semiconductor wafer; a dicing tape with a film adhesive; and a method of manufacturing a semiconductor device.

The present invention relates to a film adhesive comprising a thermoplastic resin and electrically conductive particles, the film adhesive having an adhesion strength measured at 25° C. after the film adhesive is pasted to a mirror silicon wafer at 40° C. of 0.5 N/10 mm or more.

15 Claims, 1 Drawing Sheet

(51) Int. Cl.
    H01L 21/50    (2006.01)
    C09J 7/02     (2006.01)
    C09J 9/02     (2006.01)
    C09J 11/04    (2006.01)
    H01L 23/00    (2006.01)
    C08G 59/62    (2006.01)
    C09J 163/00   (2006.01)
    C08K 3/08     (2006.01)

(52) U.S. Cl.
    CPC ........... *H01L 2224/2929* (2013.01); *H01L 2224/29339* (2013.01); *H01L 2224/29344* (2013.01); *H01L 2224/29347* (2013.01); *H01L 2224/29355* (2013.01); *H01L 2224/29388* (2013.01); *H01L 2224/29393* (2013.01); *H01L 2224/29424* (2013.01); *H01L 2224/29444* (2013.01); *H01L 2224/29447* (2013.01); *H01L 2224/29455* (2013.01); *H01L 2224/29499* (2013.01); *H01L 2224/32145* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/48145* (2013.01); *H01L 2224/48225* (2013.01); *H01L 2224/48227* (2013.01); *H01L 2224/48245* (2013.01); *H01L 2224/48247* (2013.01); *H01L 2224/73265* (2013.01); *H01L 2224/83191* (2013.01); *H01L 2224/83203* (2013.01); *H01L 2224/83851* (2013.01); *H01L 2224/83885* (2013.01); *H01L 2224/83907* (2013.01); *H01L 2224/85207* (2013.01); *H01L 2224/92* (2013.01); *H01L 2224/94* (2013.01); *H01L 2924/01322* (2013.01); *H01L 2924/181* (2013.01); *H01L 2924/3511* (2013.01); *Y10T 428/1405* (2015.01); *Y10T 428/28* (2015.01)

(56) References Cited

U.S. PATENT DOCUMENTS

| | | | |
|---|---|---|---|
| 2011/0256394 A1* | 10/2011 | Nishio | 428/354 |
| 2012/0058625 A1* | 3/2012 | Amano | H01L 21/67092 438/464 |
| 2012/0061805 A1* | 3/2012 | Amano et al. | 257/622 |
| 2012/0070960 A1* | 3/2012 | Murata et al. | 438/464 |
| 2013/0017396 A1* | 1/2013 | Shiga et al. | 428/413 |
| 2013/0281571 A1* | 10/2013 | Yoo et al. | 523/434 |

* cited by examiner

FILM ADHESIVE, DICING TAPE WITH FILM ADHESIVE, METHOD OF MANUFACTURING SEMICONDUCTOR DEVICE, AND SEMICONDUCTOR DEVICE

BACKGROUND OF THE INVENTION

1. Field of the Invention

The present invention relates to a film adhesive, a dicing tape with a film adhesive, a method of manufacturing a semiconductor device, and a semiconductor device.

2. Description of the Related Art

In the manufacture of a semiconductor device, a method of bonding a semiconductor element to a metal lead frame or the like (a so-called die bonding method) has been developed from a conventional method of using gold-silicon eutectic soldering to a method of using solder or a resin paste. At the present time, a method of using an electrically conductive resin paste is used.

However, there have been problems in the method of using a resin paste such as a decrease of the electrical conductivity due to voids, nonuniformity of the thickness of the resin paste, and contamination of a pad due to protrusion of the resin paste. A film adhesive may be used in place of the resin paste in order to solve these problems.

For example, an adhesive film is proposed in Patent Document 1 in which a specific polyimide resin can be blended to perform a thermal treatment during die bonding at low temperatures. An adhesive film is also proposed in Patent Document 2 in which an acrylic acid copolymer having a glass transition temperature of −10° C. to 50° C. or the like is blended to give flexibility so that the adhesive film has good workability.

PRIOR ART DOCUMENT

Patent Documents

Patent Document 1: JP-A-06-145639
Patent Document 2: Japanese Patent No. 4137827

SUMMARY OF THE INVENTION

In recent years, a lighter, thinner, and smaller semiconductor device has been made for the purpose of increasing capacity. Because the thickness of a semiconductor element (a semiconductor wafer) before it is cut into individual pieces is as small as 100 μm or less, the semiconductor wafer is easily warped, and handing thereof is difficult.

The adhesive film of Patent Document 2 has a high elasticity because an acrylic acid copolymer having a glass transition temperature of −10° C. or more is used, and it is necessary to paste the film under high temperatures in order to firmly paste the film to a semiconductor wafer. However, when the pasting is performed at high temperatures, warping of the semiconductor wafer occurs due to the heat. Further, the handling properties of the semiconductor wafer are not investigated in Patent Document 2. Because the semiconductor chip is picked up independently in Patent Document 2, chip breaking or chip cracking may occur.

The present invention has been made in order to solve the above-described problems, and an object thereof is to provide a film adhesive that can prevent a thermal effect to a semiconductor wafer and that can suppress warping of the semiconductor wafer; a dicing tape with a film adhesive; and a method of manufacturing a semiconductor device.

The present invention relates to a film adhesive comprising a thermoplastic resin and electrically conductive particles, the film adhesive having an adhesion strength measured at 25° C. after the film adhesive is pasted to a mirror silicon wafer at 40° C. of 0.5 N/10 mm or more. It is not necessary to paste the film adhesive at high temperatures because the film adhesive can be pasted well to a semiconductor wafer at a low temperature of about 40° C. Therefore, the thermal effect to the semiconductor wafer can be prevented, and warping of the semiconductor wafer can be prevented.

The thermoplastic resin preferably has a glass transition temperature of −40° C. to −10° C. This provides a good adhesion property at low temperatures.

The film adhesive preferably comprises a curable resin. This makes it possible to improve thermal stability.

The curable resin preferably comprises a curable resin that is solid at 25° C. and a curable resin that is liquid at 25° C., and a ratio of a weight of the curable resin that is solid at 25° C. to a weight of the curable resin that is liquid at 25° C. is preferably from 49/51 to 10/90. This provides a good adhesion property at low temperatures.

The film adhesive preferably has a thickness of 5 μm to 100 μm. This stabilizes an adhesion area to a semiconductor wafer or the like and suppresses the protrusion of the film adhesive.

A storage modulus at 25° C. is preferably 5 MPa or more. This can perform pickup well.

The film adhesive is preferably used as a die attach film.

The present invention also relates to a dicing tape with a film adhesive in which the film adhesive is laminated on a dicing tape.

When the dicing tape with a film adhesive is used in the manufacture of a semiconductor device, a semiconductor wafer can be handled in a state of being pasted to the dicing tape with a film adhesive so that the handling of the semiconductor wafer alone can be decreased. Therefore, even a thin semiconductor wafer of recent years can be handled well. When the dicing tape with a film adhesive is used, the semiconductor wafer is pasted to the film adhesive. However, because the film adhesive is used, warping of the semiconductor wafer can be suppressed.

When the film adhesive is peeled from the dicing tape under the conditions of a peeling temperature of 25° C. and a peeling rate of 300 mm/minute, the dicing tape with a film adhesive preferably has a peeling strength of 0.01 N/20 mm to 3.00 N/20 mm. This makes it possible to prevent chip fly and to perform pickup well.

The present invention also relates to a method of manufacturing a semiconductor device, the method comprising the step of die attaching a semiconductor chip to an adherend using the film adhesive.

The present invention also relates to a semiconductor device that is obtained with the manufacturing method.

According to the present invention, because the film adhesive can be pasted to a semiconductor wafer at a low temperature of about 40° C., a thermal effect to the semiconductor wafer can be prevented, and warping of the semiconductor wafer can be suppressed.

DETAILED DESCRIPTION OF THE PREFERRED EMBODIMENTS

Figure 1:
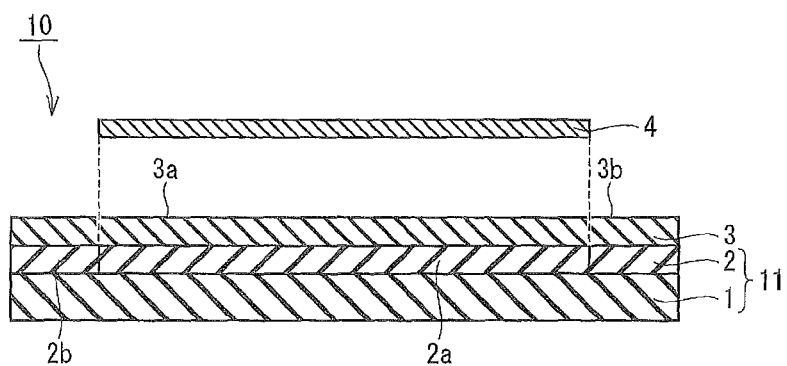
FIG. 1 is a sectional schematic view of a dicing tape with a film adhesive according to one embodiment of the present invention.

The film adhesive of the present invention has an adhesion strength measured at 25° C. after the film adhesive is pasted to a mirror silicon wafer at 40° C. of 0.5 N/10 mm or more, preferably 0.6 N/10 mm or more, and more preferably 4 N/10 mm or more. When the adhesion strength is 0.5 N/10 mm or more, the film adhesive can adhere well to a semiconductor wafer at a low temperature of about 40° C. Therefore, a thermal effect to the semiconductor wafer can be prevented, and warping of the semiconductor wafer can be suppressed. On the other hand, when the adhesion strength is less than 0.5 N/10 mm, the adhesion strength is low, and the semiconductor wafer may be peeled from the film adhesive. The upper limit of the adhesion strength is not especially limited. However, it is 10 N/10 mm or less for example.

In the present description, the adhesion strength means peeling strength when the film adhesive is peeled from the mirror silicon wafer, and can be measured according to a method described in Examples.

The film adhesive has a storage modulus at 25° C. of preferably 5 MPa or more, and more preferably $2 \times 10^2$ MPa or more. When the storage modulus is less than 5 MPa, adhesion strength with a dicing tape becomes high, and the pickup property tends to decrease. The film adhesive has a storage modulus at 25° C. of preferably $5 \times 10^3$ MPa or less, more preferably $3 \times 10^3$ MPa or less, and furthermore preferably $2.5 \times 10^3$ MPa or less. It is difficult to produce the film adhesive having a storage modulus exceeding $5 \times 10^3$ MPa in terms of blending.

The storage modulus can be measured according to a method described in Examples.

The film adhesive has a storage modulus at 100° C. of preferably 0.01 MPa or more, and more preferably 0.05 MPa or more. When the storage modulus is 0.01 MPa or more, it is difficult for the film adhesive to protrude during die attaching. On the other hand, the film adhesive has a storage modulus at 100° C. of preferably 1 MPa or less, and more preferably 0.8 MPa or less. When the storage modulus is 1 MPa or less, it is difficult to generate voids during die attaching, and the die attaching tends to be stable.

The film adhesive has a surface roughness (Ra) of preferably 0.1 nm to 1,000 nm. It is difficult to produce the film adhesive having a surface roughness of less than 0.1 nm in terms of blending. On the other hand, when the surface roughness (Ra) exceeds 1,000 nm, the adhesion property at low temperatures may deteriorate. The adhesion property to an adherend during die attaching may also deteriorate.

The lower the electrical resistivity of the film adhesive at a measurement temperature of 25° C. after the film adhesive is heated at 175° C. for 5 hours is, the better it would be. For example, the electrical resistivity is $1 \times 10^{-2}$ Ω·m or less. When the electrical resistivity is $1 \times 10^{-2}$ Ω·m or less, good electrical conductivity is obtained, and the film adhesive can be used in a process of small-sized and high-density mounting.

The higher the thermal conductivity of the film adhesive at a measurement temperature of 25° C. after the film adhesive is heated at 175° C. for 5 hours is, the better it would be. For example, the thermal conductivity is 0.5 W/m·K or more. When the thermal conductivity is 0.5 W/m·K or more, a good heat-releasing property is obtained, and the film adhesive can be used in a process of small-sized and high-density mounting. When the thermal conductivity is less than 0.5 W/m·K, the heat-releasing property is poor, and the heat is accumulated to possibly cause a deterioration in electrical conductivity.

The film adhesive contains a thermoplastic resin. Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth) acrylamide-2-methylpropanesulfonic acid, (meth)acrylamidepropane sulfonic acid, sulfopropyl(meth)acrylate, and (meth)acryloyloxynaphthalenesulfonic acid; and monomers which contain a phosphoric acid group, such as 2-hydroxyethylacryloyl phosphate.

Among the acrylic resins, those preferably have a weight average molecular weight of 100,000 or more, more preferably 300,000 to 3,000,000, and further preferably 500,000 to 2,000,000. When the weight average molecular weight is within the above range, the tackiness and the heat resistance become excellent. The weight average molecular weight is a value that is measured by GPC (gel permeation chromatography) and calculated in terms of polystyrene.

The thermoplastic resin preferably has a glass transition temperature of –40° C. or more, more preferably –35° C. or more, and further preferably –25° C. or more. When the glass transition temperature is less than –40° C., the film adhesive becomes sticky and sticks to the dicing tape too much, and the pickup property tends to deteriorate. The thermoplastic resin preferably has a glass transition temperature of −10° C. or less, and more preferably −11° C. or less. When the glass transition temperature exceeds −10° C., the elasticity becomes high, and it tends to become difficult to paste the film adhesive to the semiconductor wafer at a low temperature of about 40° C. (the adhesion property at low temperatures deteriorates).

In the present specification, the glass transition temperature of the thermoplastic resin refers to a theoretical value that is obtained by the Fox formula.

A method of using the temperature at the maximum heat absorption peak measured with a differential scanning calorimeter (DSC) to obtain the glass transition temperature of the thermoplastic resin may be used as another method of determining the glass transition temperature. Specifically, a pretreatment is performed in which a sample to be measured is heated for 10 minutes at a temperature that is about 50° C. higher than the glass transition temperature of the sample to be predicted (predicted temperature), and the sample is cooled to a temperature that is 50° C. lower than the predicted temperature, and then the temperature is increased at a temperature rising rate of 5° C./minute in a nitrogen atmosphere to measure the temperature of the heat absorption starting point using a differential scanning calorimeter ("Q-2000" manufactured by TA Instruments), and this value is determined to be the glass transition temperature.

The film adhesive preferably contains a curable resin such as a thermosetting resin. This makes it possible to improve the thermal stability.

Examples of the curable resin include phenol resin, amino resin, unsaturated polyester resin, epoxy resin, polyurethane resin, silicone resin, and thermosetting polyimide resin. Particularly preferable is epoxy resin, which contains ionic impurities that corrode semiconductor elements in only a small amount. As the curing agent of the epoxy resin, phenol resin is preferable.

The epoxy resin may be any epoxy resin. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycidylisocyanurate type epoxy resins; and glycidylamine type epoxy resins. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured resin easily deteriorate.

The film adhesive preferably contains a curable resin that is solid at 25° C. and a curable resin that is liquid at 25° C. This provides a good adhesion property at low temperatures.

In the present specification, liquid at 25° C. means that the viscosity at 25° C. is less than 5,000 Pa·s, and solid at 25° C. means that the viscosity at 25° C. is 5,000 Pa·s or more.

The viscosity can be measure using model "HAAKE Roto VISCO1" manufactured by Thermo Fisher Scientific Inc.

In the film adhesive, a ratio of a weight of the curable resin that is solid at 25° C. to a weight of the curable resin that is liquid at 25° C. is preferably 49/51 to 10/90, and more preferably 45/55 to 40/60.

When the ratio of the weight of the curable resin that is solid at 25° C. is more than 49/51, it tends to become difficult to paste the film adhesive to the semiconductor wafer at a low temperature of about 40° C. (the adhesion property at low temperatures deteriorates). On the other hand, when the ratio of the weight of the curable resin that is solid at 25° C. is less than 10/90, the film adhesive becomes sticky and sticks to the dicing tape too much, and the pickup property tends to deteriorate.

The total content of the thermoplastic resin and the curable resin in the film adhesive is preferably 5% by weight or more, and more preferably 10% by weight or more. When the total content is 5% by weight or more, the film adhesive can easily maintain its shape as a film. The total content of the thermoplastic resin and the curable resin is preferably 70% by weight or less, and more preferably 60% by weight or less. When the total content is 70% by weight or less, the electrical conductivity is suitably exhibited by electrically conductive particles.

In the film adhesive, the ratio of the weight of the thermoplastic resin to the weight of the curable resin is preferably 50/50 to 10/90, and more preferably 40/60 to 15/85. When the ratio of the weight of the thermoplastic resin is more then 50/50, the thermal stability tends to deteriorate. When the ratio of the weight of the thermoplastic resin is less than 10/90, it tends to become difficult to make the adhesive into a film.

The film adhesive contains electrically conductive particles. The electrically conductive particles are not especially limited. Examples thereof include nickel particles, copper particles, silver particles, gold particles, aluminum particles, carbon black particles, carbon nanotubes that are fiber-like particles, and particles in which the surface of core particle is covered with an electrically conductive material.

The core particle may be electrically conductive or non-electrically conductive. For example, glass particles can be used. Examples of the electrically conductive material for covering the surface of the core particle are metals such as nickel, copper, silver, gold, and aluminum.

A shape of the electrically conductive particle is not limited. Examples thereof include a flake shape, a needle shape, a filament shape, a sphere, and a scale shape. Of these shapes, a flake shape is preferable in terms of improvements in dispersibility and filling rate.

An average particle size of the electrically conductive particles is not especially limited. The average particle size is preferably 0.001 times or more the thickness of the film adhesive (the thickness of the film adhesive ×0.001 or more), and more preferably 0.1 times or more. When the average particle size is less than 0.001 times, formation of an electrically conductive path tends to be difficult, and the electrical conductivity tends to be unstable. The average particle size of the electrically conductive particles is preferably 1 time or less the thickness of the film adhesive (the thickness of the film adhesive or less), and more preferably 0.8 times or less. When the average particle size exceeds 1 time, there is the risk of generating chip cracking.

The average particle size of the electrically conductive particles is a value that is obtained with a particle size distribution analyzer ("LA-910" manufactured by HORIBA, Ltd.).

The electrically conductive particles preferably have a specific gravity of 0.7 or more, and more preferably 1 or more. When the specific gravity is less than 0.7, the electrically conductive particles float when an adhesive composition solution (varnish) is produced, and the electrically conductive particles may be dispersed nonuniformly. The electrically conductive particles preferably have a specific gravity of 22 or less, and more preferably 21 or less. When the specific gravity exceeds 22, the electrically conductive particles can easily sink, and the electrically conductive particles may be dispersed nonuniformly.

A content of the electrically conductive particles in the film adhesive is preferably 30% by weight or more, and more preferably 40% by weight or more. When the content is less than 30% by weight, formation of an electrically conductive path tends to be difficult. The content of the electrically conductive particles is preferably 95% by weight or less, and more preferably 94% by weight or less. When the content exceeds 95% by weight, it tends to become difficult to make the adhesive into a film. In addition, adhesion strength to the wafer tends to decrease.

The film adhesive may appropriately contain, other than the above-mentioned components, compounding agents that are generally used in the manufacture of a film such as a crosslinking agent.

The film adhesive of the present invention can be manufactured by an ordinary method. For example, an adhesive composition solution that contains each of the above-described components is produced, the adhesive composition solution is applied onto a base separator to form a coating film so as to have a prescribed thickness, and the coating film is then dried to manufacture a film adhesive.

A solvent that is used in the adhesive composition solution is not especially limited. However, an organic solvent is preferable which allows each of the above-described components to be dissolved, kneaded, or dispersed, uniformly. Examples thereof include ketone-based solvents such as dimethylformamide, dimethylacetoamide, N-methylpyrrolidone, acetone, methylethylketone, and cyclohexane; toluene; and xylene. The applying method is not especially limited. Examples of methods of coating a solvent include a die coater, a gravure coater, a roll coater, a reverse coater, a comma coater, a pipe doctor coater, and screen printing. Among these, a die coater is preferable in terms of high uniformity in application thickness.

Polyethylenetelephthalate (PET), polyethylene, polypropylene, a plastic film, a paper, etc. whose surface is coated with a peeling agent such as a fluorine based peeling agent and a long chain alkylacrylate based peeling agent can be also used as the base separator. Examples of the applying method of the adhesive composition solution include roll coating, screen coating, and gravure coating. A drying condition of the coating film is not especially limited. For example, drying can be performed at a drying temperature of 70° C. to 160° C. and a drying time of 1 minute to 5 minutes.

A method of mixing each of the above-described components with a mixer and press-molding the obtained mixture to manufacture a film adhesive is also suitable as the method of manufacturing a film adhesive of the present invention. Examples of the mixer include a planetary mixer.

A thickness of the film adhesive is not especially limited. However, the thickness is preferably 5 μm or more, and more preferably 15 μm or more. When the thickness is less than 5 μm, portions are generated which do not adhere to a warped semiconductor wafer or to a semiconductor chip, and the adhesion area may become unstable. The thickness of the film adhesive is preferably 100 μm or less, and more preferably 50 μm or less. When the thickness exceeds 100 μm, the film adhesive protrudes excessively due to the load of die attach, and a pad may be contaminated.

The film adhesive of the present invention can be suitably used in the manufacture of a semiconductor device. It is especially suitably used as a die attach film that bonds (die-attaches) an adherend such as a lead frame and a semiconductor chip. Examples of the adherend include a lead frame, an interposer, and a semiconductor chip. Among these adherends, a lead frame is preferable.

The film adhesive of the present invention is preferably used with a dicing tape in an integrated manner. That is, the film adhesive is preferably used in a form of a dicing tape with a film adhesive. When the film adhesive is used in this form, a semiconductor wafer that is pasted to the dicing tape with a film adhesive can be handled so that the handling of a semiconductor wafer alone can be decreased, and a good handling property can be obtained. Therefore, even a thin semiconductor wafer of recent years can be handled well. When the film adhesive is used in this form, the semiconductor wafer is pasted to the film adhesive. However, the above-described film adhesive is used so that warping of the semiconductor wafer can be suppressed.

[Dicing Tape with Film Adhesive]

Figure 2:
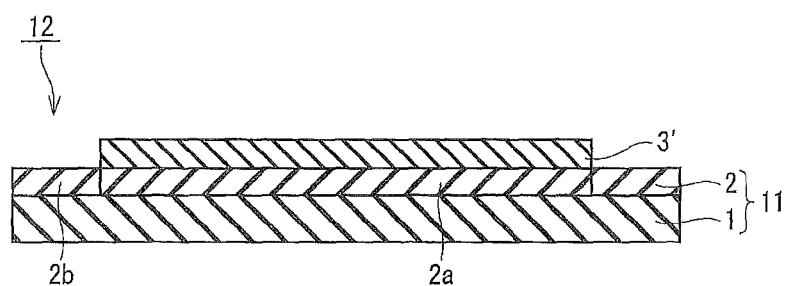
FIG. 2 is a sectional schematic view of a dicing tape with a film adhesive according to another embodiment of the present invention.

The dicing tape with a film adhesive of the present invention is will be described below. FIG. 1 is a sectional schematic view of a dicing tape with a film adhesive according to one embodiment of the present invention. FIG. 2 is a sectional schematic view of a dicing tape with a film adhesive according to another embodiment of the present invention.

As shown in FIG. 1, a dicing tape with a film adhesive 10 has a configuration in which a film adhesive 3 is laminated on a dicing tape 11. The dicing tape 11 is configured by laminating a pressure-sensitive adhesive layer 2 on a base material 1, and the film adhesive 3 is provided on the pressure-sensitive adhesive layer 2. Further, the present invention may also have a configuration in which a film adhesive 3' is formed only on a work piece (a semiconductor wafer or the like) pasting portion as a dicing tape with a film adhesive 12 shown in FIG. 2.

The base material 1 is a base body for strength of the dicing tape with a film adhesive 10 and 12, and preferably has ultraviolet-ray permeability. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth) acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper);

glass; glass cloth; a fluorine resin; polyvinyl chloride; polyvinylidene chloride; a cellulose resin; a silicone resin; metal (foil); and paper.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base material 1 in order to improve adhesiveness, holding properties, etc. with the adjacent layer.

The thickness of the base material 1 can be appropriately decided without limitation particularly. However, it is generally about 5 μm to 200 μm.

The pressure-sensitive adhesive used for the formation of the pressure-sensitive adhesive layer 2 is not especially limited, and general pressure-sensitive adhesives such as an acrylic pressure-sensitive adhesive and a rubber pressure-sensitive adhesive can be used. An acrylic pressure-sensitive adhesive containing an acrylic polymer as a base polymer is preferable as the pressure-sensitive adhesive from the viewpoint of cleaning and washing properties of an electronic part such as a semiconductor wafer or a glass part that dislike contamination with ultrapure water or an organic solvent such as alcohol.

Specific examples of the acrylic ester include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl(meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer (s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy(meth)acrylate, polyester(meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate manner such as a solution polymerization manner, an emulsion polymerization manner, a bulk polymerization manner, and a suspension polymerization manner to a mixture of one or two or more kinds of component monomers for example. Since the pressure-sensitive adhesive layer preferably has a composition in which the content of low molecular weight materials is suppressed from the viewpoint of prevention of wafer contamination, and since those in which an acryl polymer having a weight average molecular weight of 300000 or more, particularly 400000 to 30000000 is as a main component are preferable from such viewpoint, the pressure-sensitive adhesive can be made to be an appropriate cross-linking type with an internal cross-linking manner, an external cross-linking manner, etc.

An external crosslinking agent can be appropriately adopted in the pressure-sensitive adhesive to increase the number average molecular weight of the acrylic polymer or the like that is the base polymer. Specific examples of an external crosslinking method include a method of adding a so-called crosslinking agent such as a polyisocyanate compound, an epoxy compound, an aziridine compound, or a melamine crosslinking agent and reacting the product. When the external crosslinking agent is used, the used amount is appropriately determined by a balance with the base polymer to be crosslinked and further by the use as the pressure-sensitive adhesive. Generally, it is about 5 parts by weight or less, and preferably 0.1 to 5 parts by weight to 100 parts by weight of the base polymer. Further, conventionally known various additives such as a tackifier and an antioxidant may be used in the pressure-sensitive adhesive other than the above-described components as necessary.

The pressure-sensitive adhesive layer 2 can be formed with a radiation curing-type pressure-sensitive adhesive. The adhesive strength of the radiation curing-type pressure-sensitive adhesive can be reduced easily by increasing the degree of crosslinking by irradiation with an ultraviolet ray or the like.

A difference in the adhesive strength with the portion 2b may be created by irradiating with a radiation only the portion 2a that corresponds to the workpiece pasting portion of the pressure-sensitive adhesive layer 2 shown in FIG. 1. In this case, the portion 2b that is formed with an uncured radiation curing-type pressure-sensitive adhesive adheres to the adhesive film 3, and the holding power can be secured during dicing.

The portion 2a where the adhesive strength is remarkably reduced can be formed by curing the radiation curing-type pressure-sensitive adhesive layer 2 in accordance with the adhesive film 3' shown in FIG. 2. In this case, a wafer ring can be fixed to the portion 2b that is formed with an uncured radiation curing-type pressure-sensitive adhesive.

That is, when the pressure-sensitive adhesive layer 2 is formed with a radiation curing-type pressure-sensitive adhesive, the portion 2a is preferably irradiated with a radiation so that the adhesive strength of the portion 2a of the pressure-sensitive adhesive layer 2 becomes smaller than the adhesive strength of the portion 2b.

As the radiation curing-type pressure-sensitive adhesive, those having a radiation curable functional group such as a carbon-carbon double bond and having adherability can be used without particular limitation. An example of the radiation curing-type pressure-sensitive adhesive is an adding-type radiation curing-type pressure-sensitive adhesive in which a radiation curable monomer or oligomer component is incorporated into a general pressure-sensitive adhesive such as the acrylic pressure-sensitive adhesive or the rubber pressure-sensitive adhesive.

Examples of the radiation curing-type monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butanedioldi(meth)acrylate. Further, the radiation curing-type oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curing-type monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type radiation curing-type pressure-sensitive adhesive described above, the radiation curing-type pressure-sensitive adhesive includes an internal radiation curing-type pressure-sensitive adhesive using an acryl polymer having a radical reactive carbon-carbon double bond in the polymer side chain, in the main chain, or at the end of the main chain as the base polymer. The internal radiation curing-type pressure-sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radiation curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curable adhesive may be made only of the above-mentioned base polymer (in particular, the acrylic polymer), which has a carbon-carbon double bond. However, the above-mentioned radiation curable monomer component or oligomer component may be incorporated into the base polymer to such an extent that properties of the adhesive are not deteriorated. The amount of the radiation curable oligomer component or the like is usually 30 parts or less by weight, preferably from 0 to 10 parts by weight for 100 parts by weight of the base polymer.

The radiation curing-type pressure-sensitive adhesive preferably contains a photopolymerization initiator in the case of curing it with an ultraviolet ray or the like Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation curing-type pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The radiation curing-type pressure-sensitive adhesive layer 2 can contain a compound that is colored by radiation irradiation as necessary. By containing the compound that is colored by radiation irradiation in the pressure-sensitive adhesive layer 2, only a portion irradiated with radiation can be colored. The compound that colors by radiation irradiation is colorless or has a pale color before the irradiation. However, it is colored by irradiation with radiation. An example of the compound is a leuco dye. The ratio of use of this compound that is colored by radiation irradiation is appropriately set.

The thickness of the pressure-sensitive adhesive layer 2 is not especially limited. However, it is preferably about 1 μm to 50 μm from the viewpoint of preventing cracking on the cut surface of the chip and maintaining the fixation of the adhesive layer. It is more preferably 2 μm to 30 μm, and further preferably 5 μm to 25 μm.

The film adhesives 3 and 3' of the dicing tapes with a film adhesive 10 and 12 are preferably protected by a separator (not shown). The separator has a function as a protecting material that protects the film adhesives 3 and 3' until they are practically used. The separator is peeled when pasting a workpiece onto the film adhesives 3 and 3' of the dicing tape with a film adhesive. Polyethylenetelephthalate (PET), polyethylene, polypropylene, a plastic film, a paper, etc. whose surface is coated with a release agent such as a fluorine based release agent and a long chain alkylacrylate based release agent can be also used as the separator.

The dicing tapes with a film adhesive 10 and 12 can be manufactured by an ordinary method. For example, the pressure-sensitive adhesive layer 2 of the dicing tape 11 is pasted to the film adhesives 3 and 3' to manufacture the dicing tapes with a film adhesive 10 and 12.

When the film adhesives 3 and 3' are peeled from the dicing tape 11 under the conditions of a peeling temperature of 25° C. and a peeling rate of 300 mm/minute, the dicing tapes with a film adhesive 10 and 12 preferably have a peeling strength of 0.01 N/20 mm to 3.00 N/20 mm. When the peeling strength is less than 0.01 N/20 mm, chip fly may occur during dicing. On the other hand, when the peeling strength exceeds 3.00N/20 mm, pickup tends to become poor.

The peeling strength can be measured according to a method described in the examples.
[Method of Manufacturing Semiconductor Device]

The method of manufacturing a semiconductor device of the present invention includes a step of die-attaching a semiconductor chip to an adherend using a film adhesive.

Figure 3:
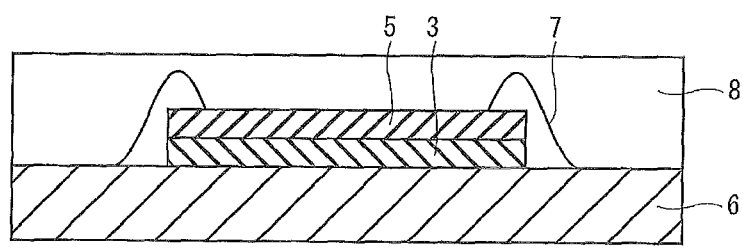
FIG. 3 is a view for illustrating one method of manufacturing a semiconductor device according to the present invention.

The method of manufacturing a semiconductor device of the present invention will be described below referring to FIG. 3 while using a case of manufacturing a semiconductor device using the dicing tape with a film adhesive 10 as an example. FIG. 3 is a sectional schematic view for illustrating one method of manufacturing a semiconductor device of the present invention.

First, a semiconductor wafer 4 is press-adhered on a semiconductor wafer pasting portion 3a of the film adhesive 3 in the dicing tape with a film adhesive 10, and it is fixed by adhering and holding (mounting step). The present step is performed while pressing with a pressing means such as a pressing roll. At this time, the press-adhering can be performed at a low temperature of about 40° C. Specifically, the press-adhering temperature (pasting temperature) is preferably 35° C. or more, and more preferably 37° C. or more. The lower the upper limit of the press-adhering temperature is, the better it would be. It is preferably 50° C. or less, more preferably 45° C. or less, and further preferably 43° C. or less. The film adhesive 3 can be pasted to the semiconductor wafer 4 at a low temperature of about 40° C. Therefore, the thermal effect to the semiconductor wafer 4 can be prevented, and warping of the semiconductor wafer 4 can be suppressed.

The pressure is preferably $1 \times 10^5$ Pa to $1 \times 10^7$ Pa, and more preferably $2 \times 10^5$ Pa to $8 \times 10^6$ Pa. The pasting time is preferably 1 second to 5 minutes, and more preferably 1 minute to 3 minutes.

Next, the dicing of the semiconductor wafer 4 is performed. Accordingly, the semiconductor wafer 4 is cut into a prescribed size and individualized, and a semiconductor chip 5 is produced. The dicing is performed following a normal method from the circuit face side of the semiconductor wafer 4, for example. Further, the present step can adopt such as a cutting method called full-cut that forms a slit in the dicing tape with a film adhesive 10. The dicing apparatus used in the present step is not particularly limited, and a conventionally known apparatus can be used. Further, because the semiconductor wafer 4 is adhered and fixed by the dicing tape with a film adhesive 10, chip crack and chip fly can be suppressed, and at the same time the damage of the semiconductor wafer 4 can be also suppressed.

Pickup of the semiconductor chip 5 is performed in order to peel the semiconductor chip 5 that is adhered and fixed to the dicing tape with a film adhesive 10. The method of picking up is not particularly limited, and various conventionally known methods can be adopted. Examples include a method of pushing up the individual semiconductor chip 5 from the dicing tape with a film adhesive 10 side with a needle and picking up the pushed semiconductor chip 5 with a picking-up apparatus.

When the pressure-sensitive adhesive layer 2 is an ultraviolet-ray curing layer, pickup is performed after irradiating the pressure-sensitive adhesive layer 2 with ultraviolet-rays. Accordingly, the adhesive strength of the pressure-sensitive adhesive layer 2 to the film adhesive 3 decreases, and the peeling of the semiconductor chip 5 becomes easy. As a result, picking up becomes possible without damaging the semiconductor chip 5. The condition such as irradiation intensity and irradiation time when irradiating an ultraviolet ray is not particularly limited, and it may be appropriately set depending on necessity.

The semiconductor chip 5 that is picked up is adhered and fixed onto an adherend 6 through the film adhesive 3 (die attaching) interposed therebetween.

The die attaching temperature is preferably 80° C. or more, and more preferably 90° C. or more. The die attaching temperature is preferably 150° C. or less, and more preferably 130° C. or less. By making the temperature 150° C. or less, the generation of warping after die attaching can be prevented.

Then, the film adhesive 3 is subjected to a heat treatment, and the semiconductor chip 5 is adhered to the adherend 6.

The temperature of the heat treatment is preferably 80° C. or more, and more preferably 170° C. or more. The temperature of the heat treatment is preferably 200° C. or less, and more preferably 180° C. or less. When the temperature of the heat treatment is within this range, good adhesion between the semiconductor wafer 5 and the adherend 6 can be obtained. The time of the heat treatment can be appropriately set.

Next, a wire bonding step of electrically connecting the tip of a terminal part (inner lead) of the adherend 6 with an electrode pad (not shown) on the semiconductor chip 5 with a bonding wire 7 is performed. The bonding wires 7 may be, for example, gold wires, aluminum wires, or copper wires. The temperature when the wire bonding is performed is preferably 80° C. or more, and more preferably 120° C. or more; and the temperature is preferably 250° C. or less, and more preferably 175° C. or less. The heating time is from several seconds to several minutes (for example, 1 second to 1 minute). The connection of the wires is performed using a combination of vibration energy based on ultrasonic waves with compression energy based on the application of pressure in the state that the wires are heated to a temperature in the above-mentioned range.

Then, a sealing step sealing the semiconductor chip 5 with a sealing resin 8 is performed. This step is performed for protecting the semiconductor chip 5 that is loaded on the adherend 6 and the bonding wire 7. This step is performed by molding a resin for sealing with a mold. An example of the sealing resin 8 is an epoxy resin. The heating temperature during the resin sealing is preferably 165° C. or more, and more preferably 170° C. or more; and the heating temperature is preferably 185° C. or less, and more preferably 180° C. or less.

The sealed product may be further heated (post curing step) as necessary. This makes it possible to completely cure the sealing resin 8 that is insufficiently cured in the sealing step. The heating temperature can be appropriately set.

When the dicing tape with a film adhesive is used, a semiconductor device can be manufactured as described above with a method including a step (I) of pasting the film adhesive of the dicing tape with a film adhesive to a semiconductor wafer; a step (II) of dicing the semiconductor wafer to form a semiconductor chip; a step (III) of picking up the semiconductor chip that is formed in the step (II) together with the film adhesive; and a step (IV) of die-attaching the semiconductor chip that is picked up in the step (III) to an adherend through the film adhesive interposed therebetween.

EXAMPLES

Below, the present invention will be described in detail by way of examples. However, the present invention is not limited to the examples below as long as the invention does not exceed the gist thereof. In addition, "parts" in these examples means "parts by weight" as long as there is no special description.

The components that were used in the examples are explained.

Arontack S-2060: Arontack S-2060 (Acrylic copolymer, Mw: 550,000, glass transition temperature: −22° C.) manufactured by TOAGOSEI CO., LTD.

Teisan Resin SG-70L: Teisan Resin SG-70L (Acrylic copolymer, Mw: 900,000, glass transition temperature: −13° C.) manufactured by Nagase ChemteX Corporation Teisan Resin SG-P3: Teisan Resin SG-P3 (Acrylic copolymer, Mw: 850,000, glass transition temperature: 12° C.) manufactured by Nagase ChemteX Corporation EOCN-1020-4: EOCN-1020-4 (Epoxy resin that is solid at 25° C.) manufactured by Nippon Kayaku Co., Ltd.

JER828: JER828 (Epoxy resin that is liquid at 25° C.) manufactured by Mitsubishi Chemical Corporation MEH-7851SS: MEH-7851SS (Phenolaralkyl resin) manufactured by Meiwa Plastic Industries, Ltd 1400YM: 1400YM (Copper powder, average particles size 4 μm, specific gravity 8.9) manufactured by MITSUI MINING & SMELTING CO., LTD.

ES-6000: ES-6000 (Silver glass beads, average particle size 6 μm, specific gravity 3.9 to 4.0) manufactured by Potters-Ballotini Co., Ltd.

AUP-1000: AUP-1000 (Gold powders, average particle size 1 μm, specific gravity 19.3) manufactured by OSAKI INDUSTRY Co., Ltd.

[Production of Film Adhesive and Dicing Tape with Film Adhesive]

Examples 1 to 3 and Comparative Examples 1 to 3

According to the ratio of blending of compounds described in Table 1, each component in Table 1 and a solvent (methylethylketone) were placed in a stirring pot of a hybrid mixer (HM-500 manufactured by KEYENCE CORPORATION), and they were stirred and mixed in a stirring mode for 3 minutes. The obtained varnish was applied onto a released-treated film (MRA50 manufactured by Mitsubishi Plastics, Inc.) with a die coater, followed by drying, so that a film adhesive was produced.

The obtained film adhesive was cut out into a circular shape having a diameter of 230 mm, and it was pasted onto a pressure-sensitive adhesive layer of a dicing tape (P2130G manufactured by NITTO DENKO CORPORATION) at 25° C. to produce a dicing tape with a film adhesive.

Examples 4 to 6 and Comparative Examples 4 to 6

According to the ratio of blending of compounds described in Table 2, each component in Table 2 was placed in a stirring pot of a planetary mixer (T.K. HIVIS MIX "P-03" manufactured by PRIMIX Corporation), and they were stirred and mixed at 90° C. for 20 minutes. A pressure of 1 kg/cm² was applied on the obtained mixture at 120° C. with a molding press (VH1-1572 manufactured by KITAGAWA SEIKI Co., Ltd.) to produce a film adhesive.

The obtained film adhesive was cut out into a circular shape having a diameter of 230 mm, and it was pasted onto a pressure-sensitive adhesive layer of a dicing tape (P2130G manufactured by NITTO DENKO CORPORATION) at 25° C. to produce a dicing tape with a film adhesive.

[Production of Mirror Silicon Wafer]

A silicon wafer (manufactured by Shin-Etsu Chemical Co., Ltd., thickness 0.6 mm) was ground to have a thickness of 0.05 mm using a back grinder (DFG-8560 manufactured by DISCO Corporation) so that a mirror silicon wafer was produced.

[Evaluation]

The following evaluations were performed using the obtained film adhesive, dicing tape with the film adhesive, and mirror silicon wafer. The results are shown in Tables 1 and 2.

[Evaluation of Adhesion Property at Low Temperatures (1)]

The mirror silicon wafer was pasted onto the film adhesive of the dicing tape with the film adhesive at a pasting rate of 10 mm/minute and a pasting temperature of 40° C. using a wafer mounter (MA-3000III manufactured by Nitto Seiki Co., Ltd.).

The workpiece that was obtained by pasting was arranged so that the mirror silicon wafer faced the bottom side (ground side). A case where even a portion of the mirror silicon wafer fell off from the film adhesive was marked as x, and a case where the mirror silicon wafer did not fall off was marked as ○.

[Evaluation of Adhesion Property at Low Temperatures (2)]

A polyester pressure-sensitive adhesive tape (BT-315 manufactured by NITTO DENKO CORPORATION) was pasted onto the film adhesive of the dicing tape with the film adhesive for the purpose of holding the workpiece together, and it was cut to a width of 10 mm. Then, a laminate consisting of the film adhesive and the dicing tape was separated from the polyester pressure-sensitive adhesive tape. A mirror silicon wafer at 40° C. was pasted to the film adhesive surface of the laminate using a 2 kg roller. Then, it was allowed to stand at 40° C. for 2 minutes. Thereafter, it was allowed to stand at normal temperature (25° C.) for 20 minutes to obtain a sample.

A peeling test (peeling test between the mirror silicon wafer and the film adhesive) was performed on the sample at a peeling angle of 180 degrees, a peeling temperature of 25° C., and a peeling rate of 300 mm/minute using a tensile tester (AGS-J manufactured by Shimadzu Corporation).

[Evaluation of Tackiness]

The mirror silicon wafer was pasted onto the film adhesive of the dicing tape with the film adhesive at a pasting rate of 10 mm/minute and a pasting temperature of 40° C. using a wafer mounter (MA-3000III manufactured by Nitto Seiki Co., Ltd.).

The workpiece that was obtained by pasting was diced (individualized) into 10 mm×10 mm square pieces using a dicer (DFD-6361 manufactured by DISCO Corporation) to obtain an individual piece. The individual piece (individual piece consisting of chip and film adhesive) was die-attached to a lead frame at 120° C., 0.1 MPa, and 1 second using a die bonder (SPA-300 manufactured by SHINKAWA LTD.). The side surface of the individual piece was observed with a scanning electron microscope after die-attaching. A case where no space was observed between the individual piece and the lead frame was marked as "No", and a case where a space was observed was marked as "Yes".

[Evaluation of Protrusion]

The mirror silicon wafer was pasted onto the film adhesive of the dicing tape with the film adhesive at a pasting rate of 10 mm/minute and a pasting temperature of 40° C. using a wafer mounter (MA-3000III manufactured by Nitto Seiki Co., Ltd.).

The workpiece that was obtained by pasting was diced (individualized) into 10 mm×10 mm square pieces using a dicer (DFD-6361 manufactured by DISCO Corporation) to obtain an individual piece. The individual piece (individual piece consisting of chip and film adhesive) was die-attached to a lead frame at 120° C., 0.4 MPa, and 1 second using a die bonder (SPA-300 manufactured by SHINKAWA LTD.). The individual piece was observed from the top surface with an optical microscope after die-attaching to measure the distance that the film adhesive was protruded (protrusion distance) from the side surface of the chip.

[Evaluation of Storage Modulus at 25° C.]

The film adhesive was separated from the dicing tape with the film adhesive, and the film adhesives were laminated to have a thickness of 300 μm so that a laminated consisting of film adhesives was produced. A sample having a 10 mm wide rectangular shape was cut out from the laminate.

The sample was measured at a distance between chucks of 20 mm, a temperature rising rate of 10° C./minute, in a tensile measurement mode, and from 0° C. to 50° C. using a dynamic viscoelasticity measurement apparatus (RSA III manufactured by Rheometric Scientific, Ltd.) to obtain the storage modulus at 25° C.

[Measurement of Peeling Strength between Film Adhesive and Dicing Tape]

A polyester pressure-sensitive adhesive tape (BT-315 manufactured by NITTO DENKO CORPORATION) was pasted onto the film adhesive of the dicing tape with the film adhesive for the purpose of holding the workpiece together, and it was cut 100 mm×100 mm wide to obtain a sample. The film adhesive of the sample was peeled from the dicing tape at a peeling rate of 300 mm/minute, a peeling temperature of 25° C., and with a T peel to measure the peeling strength.

[Comprehensive Evaluation]

A case where all of the following conditions were satisfied was marked as ○, and a case where any one of the conditions was not satisfied was marked as x.

Condition (1): The result of the Evaluation of Adhesion Property at Low Temperatures (1) is ○.

Condition (2): The adhesion strength measured in the Evaluation of Adhesion Property at Low Temperatures (2) is 0.5 N/10 mm or more.

Condition (3): The result of the Evaluation of Tackiness was "No".

Condition (4): The protrusion distance measured in the Evaluation of Protrusion was 100 μm or less.

Condition (5): The result of the Evaluation of Storage Modulus at 25° C. was 5 MPa or more.

Condition (6): The result of the Measurement of Peeling Strength between Film Adhesive and Dicing Tape was 0.01 N/20 mm to 3.00 N/20 mm.

TABLE 1

| | | Trade Name of | Example | | | Example | | | Example | | | Comparative Example | | |
|---|---|---|---|---|---|---|---|---|---|---|---|---|---|---|
| | Material | Material | 1-1 | 1-2 | 1-3 | 2-1 | 2-2 | 2-3 | 3-1 | 3-2 | 3-3 | 1 | 2 | 3 |
| Blend-ing | Thermo-plastic | Arontack S-2060 | 10 | 10 | 10 | — | — | — | — | — | — | — | — | — |

TABLE 1-continued

| | | Trade Name of Material | Example 1-1 | Example 1-2 | Example 1-3 | Example 2-1 | Example 2-2 | Example 2-3 | Example 3-1 | Example 3-2 | Example 3-3 | Comparative Example 1 | Comparative Example 2 | Comparative Example 3 |
|---|---|---|---|---|---|---|---|---|---|---|---|---|---|---|
| (Solid Content Ratio) (Parts by Weight) | Resin | Teisan Resin SG-70L | — | — | — | 2.8 | 2.8 | 2.8 | 12 | 12 | 12 | — | — | 2.8 |
| | | Teisan Resin SG-P3 | — | — | — | — | — | — | — | — | — | 16 | 2.8 | — |
| | Curable Resin | EOCN-1020-4 (Solid) | 15 | 15 | 15 | 0.6 | 0.6 | 0.6 | 7 | 7 | 7 | 1 | 0.6 | 2.5 |
| | | JER828 (Liquid) | 15 | 15 | 15 | 3 | 3 | 3 | 20 | 20 | 20 | 1 | 3 | 1.1 |
| | Curing Agent | MEH-7851SS | 30 | 30 | 30 | 3.6 | 3.6 | 3.6 | 1 | 1 | 1 | 2 | 3.6 | 3.6 |
| | Electrically Conductive Particles | 1400YM | 30 | 30 | 30 | — | — | — | — | — | — | 80 | — | — |
| | | ES6000 | — | — | — | — | — | — | 60 | 60 | 60 | — | — | — |
| | | AUP-1000 | — | — | — | 90 | 90 | 90 | — | — | — | — | 90 | 90 |
| Thickness of Adhesive (μm) | | | 5 | 25 | 100 | 5 | 25 | 100 | 5 | 25 | 100 | 25 | 25 | 25 |
| Evaluation Result | Evaluation of Adhesion Property at Low Temperatures (1) | | ○ | ○ | ○ | ○ | ○ | ○ | ○ | ○ | ○ | X | X | X |
| | Evaluation of Adhesion Property at Low Temperatures (2) (N/10 mm) | | 9.1 | 9.1 | 9.1 | 8.8 | 8.8 | 8.8 | 5.2 | 5.2 | 5.2 | 0.3 | 0.4 | 0.1 |
| | Evaluation of Tackiness | | No | No | No | No | No | No | No | No | No | No | No | No |
| | Evaluation of Protrusion (μm) | | 0 | 2 | 10 | 0 | 1 | 14 | 1 | 5 | 34 | 0 | 0 | 0 |
| | Evaluation of Storage Modulus at 25° C. (MPa) | | $1.4 \times 10^3$ | $1.4 \times 10^3$ | $1.4 \times 10^3$ | $2.3 \times 10^3$ | $2.3 \times 10^3$ | $2.3 \times 10^3$ | $5.0 \times 10^2$ | $5.0 \times 10^2$ | $5.0 \times 10^2$ | $3.0 \times 10^3$ | $2.5 \times 10^3$ | $4.0 \times 10^3$ |
| | Measurement of Peeling Strength between Film Adhesive and Dicing Tape (N/20 mm) | | 0.03 | 0.03 | 0.03 | 0.05 | 0.05 | 0.05 | 0.11 | 0.11 | 0.11 | 0.03 | 0.03 | 0.02 |
| Comprehensive Evaluation | | | ○ | ○ | ○ | ○ | ○ | ○ | ○ | ○ | ○ | X | X | X |

TABLE 2

| | | Trade Name of Material | Example 4-1 | Example 4-2 | Example 4-3 | Example 5-1 | Example 5-2 | Example 5-3 | Example 6-1 | Example 6-2 | Example 6-3 | Comparative Example 4 | Comparative Example 5 | Comparative Example 6 |
|---|---|---|---|---|---|---|---|---|---|---|---|---|---|---|
| Blending (Solid Content Ratio) (Parts by Weight) | Thermoplastic Resin | Arontack S-2060 | 10 | 10 | 10 | — | — | — | — | — | — | — | — | — |
| | | Teisan Resin SG-70L | — | — | — | 2.8 | 2.8 | 2.8 | 12 | 12 | 12 | — | — | 2.8 |
| | | Teisan Resin SG-P3 | — | — | — | — | — | — | — | — | — | 16 | 2.8 | — |
| | Curable Resin | EOCN-1020-4 (Solid) | 15 | 15 | 15 | 0.6 | 0.6 | 0.6 | 7 | 7 | 7 | 1 | 0.6 | 2.5 |
| | | JER828 (Liquid) | 15 | 15 | 15 | 3 | 3 | 3 | 20 | 20 | 20 | 1 | 3 | 1.1 |
| | Curing Agent | MEH-7851SS | 30 | 30 | 30 | 3.6 | 3.6 | 3.6 | 1 | 1 | 1 | 2 | 3.6 | 3.6 |
| | Electrically Conductive Particles | 1400YM | 30 | 30 | 30 | — | — | — | — | — | — | 80 | — | — |
| | | ES6000 | — | — | — | — | — | — | 60 | 60 | 60 | — | — | — |
| | | AUP-1000 | — | — | — | 90 | 90 | 90 | — | — | — | — | 90 | 90 |

TABLE 2-continued

| | Trade Name of Material | Example 4-1 | Example 4-2 | Example 4-3 | Example 5-1 | Example 5-2 | Example 5-3 | Example 6-1 | Example 6-2 | Example 6-3 | Comparative Example 4 | Comparative Example 5 | Comparative Example 6 |
|---|---|---|---|---|---|---|---|---|---|---|---|---|---|
| Material | | | | | | | | | | | | | |
| Thickness of Adhesive (μm) | | 5 | 25 | 100 | 5 | 25 | 100 | 5 | 25 | 100 | 25 | 25 | 25 |
| Evaluation Result | Evaluation of Adhesion Property at Low Temperatures (1) | ○ | ○ | ○ | ○ | ○ | ○ | ○ | ○ | ○ | X | X | X |
| | Evaluation of Adhesion Property at Low Temperatures (2) (N/10 mm) | 9.1 | 9.1 | 9.1 | 8.8 | 8.8 | 8.8 | 5.2 | 5.2 | 5.2 | 0.3 | 0.4 | 0.1 |
| | Evaluation of Tackiness | No | No | No | No | No | No | No | No | No | No | No | No |
| | Evaluation of Protrusion (μm) | 0 | 2 | 10 | 0 | 1 | 14 | 1 | 5 | 34 | 0 | 0 | 0 |
| | Evaluation of Storage Modulus at 25° C. (MPa) | $1.4 \times 10^3$ | $1.4 \times 10^3$ | $1.4 \times 10^3$ | $2.3 \times 10^3$ | $2.3 \times 10^3$ | $2.3 \times 10^3$ | $5.0 \times 10^2$ | $5.0 \times 10^2$ | $5.0 \times 10^2$ | $3.0 \times 10^3$ | $2.5 \times 10^3$ | $4.0 \times 10^3$ |
| | Measurement of Peeling Strength between Film Adhesive and Dicing Tape (N/20 mm) | 0.03 | 0.03 | 0.03 | 0.05 | 0.05 | 0.05 | 0.11 | 0.11 | 0.11 | 0.03 | 0.03 | 0.02 |
| Comprehensive Evaluation | | ○ | ○ | ○ | ○ | ○ | ○ | ○ | ○ | ○ | X | X | X |

DESCRIPTION OF THE REFERENCE NUMERALS

1 base material
2 pressure-sensitive adhesive layer
3,3' film adhesive
4 semiconductor wafer
5 semiconductor chip
6 adherend
7 bonding wire
8 sealing resin
10,12 dicing tape with a film adhesive
11 dicing tape

What is claimed is:

1. A film adhesive comprising a thermoplastic resin and electrically conductive particles, the film adhesive having an adhesion strength measured at 25° C. after the film adhesive is pasted to a mirror silicon wafer at 40° C. of 0.5 N/10mm or more,
    wherein the electrically conductive particles have a specific gravity of greater than or equal to 0.7 and less than or equal to 22,
    wherein the film adhesive has a storage modulus measured at 25° C. before curing of 5 MPa or more,
    wherein the film adhesive further comprises a curable resin, the curable resin comprising a curable resin that is solid at 25° C. and a curable resin that is liquid at 25° C., and
    wherein a ratio of a weight of the curable resin that is solid at 25° C. to a weight of the curable resin that is liquid at 25° C. is 49/51 to 10/90.

2. The film adhesive according to claim 1, wherein the thermoplastic resin has a glass transition temperature of −40° C. to −10° C.

3. The film adhesive according to claim 1, which has a thickness is 5 μm to 100 μm.

4. The film adhesive according to claim 1, which is used as a die attach film.

5. A dicing tape with a film adhesive, wherein the film adhesive according to claim 1 is laminated on a dicing tape.

6. The dicing tape with a film adhesive according to claim 5, wherein when the film adhesive is peeled from the dicing tape under conditions of a peeling temperature of 25° C. and a peeling rate of 300 mm/minute, the dicing tape with a film adhesive has a peeling strength of 0.01 N/20 mm to 3.00 N/20 mm.

7. A method of manufacturing a semiconductor device comprising the step of die-attaching a semiconductor chip to an adherend using the film adhesive according to claim 1.

8. A semiconductor device, which is obtained by the manufacturing method according to claim 7.

9. The film adhesive according to claim 1, wherein the thermoplastic resin has a glass transition temperature of −35° C. to −10° C.

10. The film adhesive according to claim 1, wherein the thermoplastic resin has a glass transition temperature of −25° C. to −10° C.

11. The film adhesive according to claim 1, wherein the thermoplastic resin comprises an acrylic resin.

12. The film adhesive according to claim 11, wherein the acrylic resin has a glass transition temperature of −35° C. to −10° C.

13. The film adhesive according to claim 11, wherein the acrylic resin has a glass transition temperature of −25° C. to −10° C.

14. The film adhesive according to claim 1, further comprising epoxy resin.

15. The film adhesive according to claim 14, further comprising phenol resin.

* * * * *